United States Patent
Pütz et al.

(10) Patent No.: US 10,534,196 B2
(45) Date of Patent: Jan. 14, 2020

(54) SPECTACLE LENS AND METHOD FOR PRODUCING A SPECTACLE LENS

(71) Applicant: tooz technologies GmbH, Aalen (DE)

(72) Inventors: Jörg Pütz, Aalen (DE); Katharina Rifai, Tübingen (DE); Karsten Lindig, Erfurt (DE)

(73) Assignee: tooz technologies GmbH, Aalen (DE)

( * ) Notice: Subject to any disclaimer, the term of this patent is extended or adjusted under 35 U.S.C. 154(b) by 111 days.

(21) Appl. No.: 15/736,579

(22) PCT Filed: Jun. 1, 2016

(86) PCT No.: PCT/EP2016/062428
§ 371 (c)(1),
(2) Date: Dec. 14, 2017

(87) PCT Pub. No.: WO2016/202595
PCT Pub. Date: Dec. 22, 2016

(65) Prior Publication Data
US 2018/0173007 A1 Jun. 21, 2018

(30) Foreign Application Priority Data
Jun. 17, 2015 (DE) .................. 10 2015 109 703

(51) Int. Cl.
*G02C 7/02* (2006.01)
*G03F 7/00* (2006.01)
(Continued)

(52) U.S. Cl.
CPC ............ *G02C 7/022* (2013.01); *G03F 7/001* (2013.01); *G03F 7/16* (2013.01); *G03H 1/02* (2013.01);
(Continued)

(58) Field of Classification Search
CPC ...... G02C 2202/16; G02C 7/022; G02C 7/02; G02C 7/086; G03H 2001/0439;
(Continued)

(56) References Cited

U.S. PATENT DOCUMENTS

| 5,432,623 A | 7/1995 | Egan et al. |
| 5,997,140 A | 12/1999 | Zhang et al. |

(Continued)

FOREIGN PATENT DOCUMENTS

| CN | 1285778 | 2/2001 |
| CN | 101365589 A | 2/2009 |

(Continued)

OTHER PUBLICATIONS

Bayfol® HX—Holography Product Brochure, Bayer MaterialScience, https://www.films.covestro.com/~/media/Product%20Center/FF/Documents/Brochures/Bayfol%20HX%20-%20Holography.ashx (2 pages) (2011).
(Continued)

*Primary Examiner* — William R Alexander
(74) *Attorney, Agent, or Firm* — Myers Bigel, P.A.

(57) ABSTRACT

A spectacle lens has a transparent substrate and at least one HOE-capable polymer layer arranged on the transparent substrate. The at least one HOE-capable polymer layer is suitable for forming a holographic optical element. Related methods and apparatus are described.

9 Claims, 9 Drawing Sheets

(51) Int. Cl.
*G03F 7/16* (2006.01)
*G03H 1/02* (2006.01)
*G03H 1/04* (2006.01)

(52) U.S. Cl.
CPC ....... *G03H 1/0402* (2013.01); *G02C 2202/16* (2013.01); *G03H 2001/0264* (2013.01); *G03H 2001/0439* (2013.01); *G03H 2260/12* (2013.01); *G03H 2270/32* (2013.01)

(58) Field of Classification Search
CPC .. G03H 2260/12; G03H 2270/32; G03H 1/02; G03H 1/0402; G03F 7/001; G03F 7/16
USPC ...................................... 351/159.01
See application file for complete search history.

(56) References Cited

U.S. PATENT DOCUMENTS

| | | | |
|---|---|---|---|
| 6,139,147 | A | 10/2000 | Zhang |
| 10,274,660 | B2* | 4/2019 | Dimov ................ G02B 5/188 |
| 2001/0055094 | A1 | 12/2001 | Zhang |
| 2004/0108971 | A1 | 6/2004 | Waldern et al. |
| 2007/0013983 | A1* | 1/2007 | Kitamura ............ G02B 5/1842 359/3 |
| 2009/0237758 | A1* | 9/2009 | Begon ................ G03H 1/0841 359/2 |
| 2010/0203241 | A1 | 8/2010 | Weiser et al. |
| 2012/0280956 | A1* | 11/2012 | Yamamoto ........... G02B 26/101 345/204 |
| 2014/0240805 | A1* | 8/2014 | Azakami ................ G03F 7/001 359/3 |
| 2015/0153484 | A1 | 6/2015 | Neuffer |
| 2017/0075139 | A1 | 3/2017 | Sessner et al. |

FOREIGN PATENT DOCUMENTS

| | | |
|---|---|---|
| CN | 101712746 | 5/2010 |
| DE | 102014209792 | 5/2014 |
| JP | 10133554 | 5/1998 |
| JP | 2002500381 | 1/2002 |
| JP | 2009003196 | 1/2009 |
| WO | WO 2014/155288 A2 | 10/2014 |

OTHER PUBLICATIONS

International Search Report of the International Searching Authority corresponding to International Patent Application No. PCT/EP2016/062428 (3 pages) (dated Aug. 17, 2016).

Japanese Office Action and English Language Translation corresponding to Japanese Patent Application No. 2017-564017 dated Oct. 26, 2018 (6 pages).

Office Action and English language machine translation, CN Application No. 201680035388.6, dated Sep. 6, 2019, 17 pp.

\* cited by examiner ically refer to optical structural elements in which the holographic properties are used to achieve a specified beam path of the light, such as, for example, focussing or collection, dispersion, and/or mirroring. In this manner, specified optical functionalities can be implemented. The holographic properties in turn utilize the wave nature of light, more specifically coherence and interference effects. In this case both the intensity and the phase of the light are taken into consideration.

SPECTACLE LENS AND METHOD FOR PRODUCING A SPECTACLE LENS

CROSS REFERENCE TO RELATED APPLICATIONS

This application is a 35 U.S.C. § 371 national stage application of PCT International Application No. PCT/EP2016/062428, filed on Jun. 1, 2016, which claims priority from German Patent Application No. DE 102015109703.6, filed on Jun. 17, 2015, the contents of which are incorporated herein by reference in their entireties. The above-referenced PCT International Application was published in the German language as International Publication No. WO 2016/202595 A1 on Dec. 22, 2016.

TECHNICAL FIELD

Embodiments of the invention relate to a spectacle lens and a method for producing a spectacle lens and spectacles. More particularly, various embodiments relate to techniques for forming an HOE-capable polymer layer that is arranged on a substrate of the spectacle lens and is suitable for forming a holographic optical element.

BACKGROUND

Techniques are known for the production of optical structural elements that form a holographic optical element (HOE). HOEs typically refer to optical structural elements in which the holographic properties are used to achieve a specified beam path of the light, such as, for example, focussing or collection, dispersion, and/or mirroring. In this manner, specified optical functionalities can be implemented. The holographic properties in turn utilize the wave nature of light, more specifically coherence and interference effects. In this case both the intensity and the phase of the light are taken into consideration.

For example, techniques are known from the document US 2001/0055094 A1, in which an optical lens is formed from polymerizable material in a mold. However, such techniques have various limitations or drawbacks. For example, the polymerizable materials suitable for forming an HOE are typically relatively soft and show low stiffness and strength. More specifically, this can lead in connection with spectacle lenses to increased susceptibility to external stresses, such as, for example, in the event of a fall or with respect to abrasive media. This can limit the resilience of the spectacle lens. Moreover, the optical functionalities that can be implemented by means of such a spectacle lens based on holographic properties such as, for example, refractive power, correction of astigmatism of the eye, chromatic correction, higher-order corrections, or corrections varying with viewing angle, etc. can be limited.

SUMMARY

There is therefore a need for improved spectacle lenses and improved methods for producing corresponding spectacle lenses. More particularly, there is a need for techniques that overcome at least one of the above-mentioned drawbacks. More particularly, there is a need for relatively robust spectacle lenses that are not highly defect-prone and can contain/accommodate an HOE.

According to an embodiment, the invention relates to a spectacle lens. The spectacle lens comprises a transparent substrate. The spectacle lens further comprises at least one HOE-capable polymer layer that is suitable for forming an HOE. The at least one HOE-capable polymer layer is arranged on the transparent substrate.

The substrate can be transparent to visible light; transmission of the visible light through the substrate can also at least partially take place. The transparent substrate can, for example, absorb individual spectral ranges of the light more strongly than other ranges; in this manner, selective transmission can be implemented. The substrate can impart a basic mechanical structure to the spectacle lens and thus provide a certain mechanical resilience of the spectacle lens. The substrate can also implement optical functionalities of the spectacle lens. For example, the substrate can constitute an optical lens. This can, for example, allow a specified refractive power of the spectacle lens to be achieved. Visual defects in the eye of a user can thus be compensated for or corrected.

Special optical mineral glasses and polymers can be used as the material for the substrate. For example, the transparent polymer substrate can be selected from the following group: polyallyl diglycol carbonate (ADC); polyurethane (PUR); acrylate and allyl systems; polythiourethanes (PTU); episulfide/thiol systems; and thermoplastics such as, for example, polycarbonate or polyamide. The center thickness of the substrate can, for example, be in the range of 1-3 mm, and preferably approx. 2 mm. In this manner, the transparent substrate can provide a relatively high robustness of the spectacle lens. Moreover, it can be possible to implement specified optical functions. The thickness of the substrate can vary as a function of location.

The at least one HOE-capable polymer layer can be arranged on the substrate in a wide variety of ways. For example, the at least one HOE-capable polymer layer can be arranged immediately adjacent to the substrate. However, it would also be possible for further layers to be arranged between the at least one HOE-capable polymer layer and the substrate, for example, a primer layer for improving the adhesion of the polymer to the substrate. Alternatively or additionally, it would also be possible for a fixing layer for fixation of the HOE-capable polymer layer on the substrate to be located between the HOE-capable polymer layer and the substrate.

The arrangement of the at least one HOE-capable polymer layer on the substrate can make it possible for the spectacle lens as a whole—despite the typically relatively soft material of the at least one HOE-capable polymer layer—to show high robustness. More specifically, the spectacle lens can be configured to be relatively stable with respect to breakage.

The HOE-capable polymer layer can, for example, comprise a matrix of a specified polymer (polymer matrix). This polymer matrix can impart a specified structure to the polymer layer.

It is possible for the at least one HOE-capable polymer layer to form the HOE. The at least one HOE-capable polymer layer can then comprise an HOE polymer. The HOE polymer can, for example, be embedded in the polymer matrix; more specifically, the HOE polymer can be different from the specified polymer that forms the polymer matrix. Induced local variations in the density of the chains of the HOE polymer typically cause a local variation in the refractive index of the HOE-capable polymer layer and thus form the HOE. A corresponding structure of the HOE polymer can, for example, be achieved by suitable exposure of a photoreactive component.

It is also possible that the HOE-capable polymer layer does not form the HOE, but it is also possible, for example, to form the HOE in the HOE-capable polymer layer by means of suitable exposure and/or further processing steps. In order for the at least one HOE-capable polymer layer to be suitable for forming the HOE, the at least one HOE-capable polymer layer can comprise the photoreactive component or a plurality of photoreactive components. The individual molecules of the photoreactive component, for example, can be embedded in the polymer matrix. The photoreactive component can comprise a polymer reactant. The polymer reactant can be converted into the above-mentioned HOE polymer, which finally forms the HOE. The conversion can take place via concatenation and/or cross-linking of shorter molecules of the polymer reactant. The conversion could also comprise rearrangement of already concatenated and/or crosslinked molecules of the polymer reactant. For example, the polymer reactant can be a photopolymer or a photomonomer.

For example, the photoreactive component can comprise a dye; for example, individual molecules of the dye can be coupled to individual molecules of the polymer reactant. It is also possible for the photoreactive component to comprise further components such as, for example, initiators, etc. By means of the dye and/or the initiator, the polymer reactant can be converted on exposure to light of a predetermined wavelength into the HOE polymer. The individual molecules of the polymer reactant can—in a situation in which the at least one HOE-capable polymer layer does not form the HOE—be unconcatenated or uncrosslinked, form relatively short chains of molecules or networks, and/or form specially arranged chains or networks of molecules. Molecules of the polymer reactant can be crosslinked and/or rearranged by exposure in a suitable wavelength range, so that the HOE polymer shows an unchanged structure and/or distribution with respect to the polymer reactant.

By means of such polymerization, the refractive index of the at least one HOE-capable polymer layer can be locally modified with respect to a value for the unexposed polymer layer.

For example, the spectacle lens can further comprise a diffusion barrier layer. The diffusion barrier layer can be immediately adjacent to the HOE-capable polymer layer. The diffusion layer can prevent the HOE polymer or the photoreactive component from diffusing over time.

In general, there are various possibilities for using the HOE for implementing optical functions. For example, the optical functionality can be selected from the following group: a lens; a mirror; a wavelength-specific mirror; a prism; a transflective beam combiner; a converging lens; a scattering lens; a concave mirror; a convex mirror; a color filter; data spectacles; and combinations thereof.

For example, relatively complex optical corrections in order to compensate for visual defects of the eye can be implemented by means of the HOE. In this respect, for example, it is possible for an optical functionality of the spectacle lens involving compensation for visual defects of the eye to be affected by both the HOE and a lens property of the substrate. The substrate and the HOE can thus interact in order to implement the optical functionality. A combined effect can be achieved. In this manner, particularly complex optical functionalities can be implemented.

For example, the HOE can be used for implementation of an imaging device. In this manner, for example, the HOE can allow implementation of data spectacles, which more specifically produce an image from data. The data spectacles can be used as a head-worn device (HWD). Data spectacles are devices that are worn on the head like conventional spectacles, and on the one hand, these data spectacles allow observation of the environment, and on the other, they allow observation of imaged data. The term data is to be understood here in a general sense, and can refer to symbols, signs, numbers, pictures, videos and the like. With other devices, it is only possible to observe data, but not to simultaneously observe the environment. The data can be presented in a context-related manner, overlapping with the environment (augmented), and for example can relate to data, navigation data, message data, notifications, documentation, virtual input interfaces, etc., supplementing the surrounding scene.

In the framework of data spectacles, the HOE can implement a wide variety of optical functions, for example, more specifically, for light emitted by a light source assembly of the data spectacles; for example, it would be possible for the spectacle lens to have an optical functionality as a light-conducting element of an imaging device. For this purpose, the HOE can be configured as a wavelength-specific mirror that modifies light of a predetermined wavelength range, i.e., more specifically, for example, "diverts" the light in the direction of an observation site or reflects it as a virtual intermediate image that can be observed by the user and transmits light of other wavelengths unchanged. In this manner, the HOE can act as a transflective beam combiner, which for example diverts light of a predetermined wavelength range coming from a light source assembly of the data spectacles toward the eye of a user and transmits wavelengths of ambient light other than the predetermined wavelength range unchanged. In addition, the HOE, in connection with the data spectacles, can have optical functionalities with further optical effect functions. For example, the HOE can be active for a specified angular range and leave other angular ranges unaffected, i.e. implement a wavelength-specific reflector.

The spectacle lens of the data spectacles can have a plurality of HOEs. A first HOE can be configured to divert light coming from a light source assembly to a further HOE. A further HOE can be configured to decouple the light coupled in the spectacle lens in the direction of the eye of the user, so that the user observes an image of the image generator at a specified viewing angle.

As a further application, identification and/or trademark elements (branding) can be implemented by means of the HOE. For example, a serial number of the spectacle lens could be displayed by the HOE in a relatively forgery-proof manner. Alternatively or additionally, a manufacturer of the spectacle lens could be displayed by the HOE. For this purpose, alternatively or additionally, a personal identification characteristic of the spectacle wearer or the spectacle could be displayed by the HOE in a manner recognizable for the owner or the optician.

By means of the above-described techniques, it is therefore possible to integrate a relatively soft material of the at least one HOE-capable polymer layer into the spectacle lens in a such a way that essential physical properties of the spectacle lens, such as, for example, the optical function and mechanical strength, are not impaired or are impaired only to a negligible extent by the at least one HOE-capable polymer layer—for example, compared to a reference implementation without an HOE-capable polymer layer. Typically, conventional spectacle lenses have a layer that is comparable to the substrate of the spectacle lens according to embodiment currently under discussion. More particularly, it can be possible for conventional spectacle lenses to comprise layers that have properties similar to those of the HOE-capable polymer layer. It can therefore be possible for such an HOE-capable polymer layer to be integrated into an existing layer system without impairing the optical function thereof.

For example, the spectacle lens can further comprise a transparent hard layer arranged on the transparent substrate. The at least one HOE-capable polymer layer can be arranged between the transparent substrate and the hard layer.

The hard layer can comprise a material that imparts to the hard layer relatively high stiffness and strength—for example, compared to at least one HOE-capable polymer layer and the substrate. In this manner, particularly high robustness of the spectacle lens can be achieved. The hard layer can thus improve the thermal and mechanical properties of the spectacle lens. For example, the hard layer can comprise organic material. For example, the hard layer can comprise organic/inorganic hybrid materials, such as polysiloxane-based materials.

The hard layer can be provided to improve the adhesion of an antireflective layer or a clean-coat layer to the substrate. Optionally, the spectacle lens could also comprise the antireflective layer. Alternatively or additionally, the spectacle lens could also comprise the clean-coat layer. For example, both layers can comprise inorganic materials. For example, the antireflective layer and the clean-coat layer can contain a predominant portion of inorganic materials.

For example, the antireflective layer and/or the clean-coat layer can be arranged on one side of the substrate, which faces toward the one front side of the spectacle lens. For example, the following layer sequence could be implemented: (back side): substrate—HOE-capable polymer layer—hard layer—antireflective layer—clean-coat layer (front side).

Alternatively or additionally, it would also be possible for the antireflective layer and/or the clean-coat layer to be arranged on a side of the substrate that faces toward the one back side of the spectacle lens. For example, the following layer sequence could be implemented: (back side) clean-coat layer—antireflective layer—hard layer—substrate—HOE-capable polymer layer—hard layer—antireflective layer—clean-coat layer (front side).

For example, the antireflective layer can comprise at least two materials of the following group in a stacked arrangement: $SiO_2$, $TiO_2$, $ZrO_2$, $Al_2O_3$. In this manner, for example, an interference layer stack of oxidic materials can be formed. The layer thickness of the antireflective layer can be in the range, for example, of 200-700 nm, and preferably 300-500 nm. By means of the antireflective layer, reduced reflection of the spectacle lens can be implemented as an optical functionality; the reflectivity level for light incident on the front side of the spectacle lens can be reduced; alternatively or additionally, the reflectivity level for light incident on the back side of the spectacle lens can be reduced. Light reflections can be reduced.

The clean-coat layer can be provided on the front side or the back side of the spectacle lens in order to prevent dirt from adhering. For example, the front side can be convex and/or the back side can be concave. The layer thickness of the clean-coat layer can be in the range of 5-50 nm, and preferably in the range of less than 10 nm. For example, the clean-coat layer can comprise a material with hydrophobic and/or oleophobic properties.

In general, it is also possible for the spectacle lens to further comprise the antireflective layer arranged on the transparent substrate. The at least one HOE-capable polymer layer can be arranged between the transparent substrate and the antireflective layer. More specifically, in such a scenario, it may be unnecessary to provide the hard layer. More particularly, the antireflective layer can be directly applied to the HOE-capable polymer layer.

For example, the layer thickness of each of the at least one HOE-capable polymer layer can be in the range of 1 μm-100 μm, and preferably in the range of 10 μm-100 μm. Such a layer thickness can make it possible to configure the optical functionality of the HOE in a particularly flexible manner. Complex optical functionalities can be implemented. This can make it possible to carry out relatively strong optical corrections. A layer thickness in the range of a few μm can be sufficient for implementation of optical functionalities.

It can be possible for an average refractive index of the at least one HOE-capable polymer layer to be essentially the same as a refractive index of the transparent substrate and/or the hard layer, for example, irrespective of a local variation in the refractive index due to the local concatenation of the polymer in the HOE-capable polymer layer. In this case, "essentially the same" can mean that a deviation of the refractive index—for example, taking into account variations in the layer thickness of the at least one HOE-capable polymer layer—causes no or no significant interference effects, such as, for example, interference rings, etc. In this respect, it can be possible for the HOE-capable polymer layer to comprise at least one oxide material such as, for example, $TiO_2$ nanoparticles and/or an aromatic system and/or thiol components as (an) additive(s); typically, by means of a corresponding concentration, the refractive index of the HOE-capable polymer layer can be selectively controlled.

For example, the at least one HOE-capable polymer layer can be arranged on a front side of the transparent substrate. It would also be possible for the at least one HOE-capable polymer layer to be arranged on a back side of the transparent substrate.

For example, it would be possible for the front side to be convex. Alternatively or additionally, it would be possible for the back side to be concave. For example, this can be a one-sided concave substrate or spectacle lens.

In general, the spectacle lens can comprise one or a plurality of HOE-capable polymer layers. For example, it would be possible for a first HOE-capable polymer layer to be arranged on the convex front side of the transparent substrate and a second HOE-capable polymer layer to be arranged on the concave back side of the transparent substrate. It is possible for the spectacle lens to comprise one or two adjacent diffusion barrier layers for each HOE-capable polymer layer.

The spectacle lens can further comprise the primer layer. The primer layer can, for example, comprise the polymer matrix and/or a further polymer. It is possible for the primer layer to comprise a photoreactive component, i.e. separately from the HOE-capable polymer layer, which, for example—provided the HOE has not yet been formed—can have a photoreactive component. It is also possible for the primer layer not to comprise the HOE polymer. The primer layer may be unsuitable for forming the HOE. For example, the primer layer can be applied from a polymer dispersion.

The layer thickness of the primer layer can in the range of 0.7-1.0 μm. Typically, the material used for the primer layer is relatively soft. For this reason, the primer layer can provide improved adhesion of the hard layer and the antireflective layer or the clean-coat layer to the substrate. Moreover, the primer layer can serve as a stress-absorbing substrate; this allows stresses, such as may occur, for example, in the ball drop impact test according to the FDA standard, to be better absorbed.

It is typically possible for the material of the primer layer to be similar to the material of the HOE-capable polymer layer, and more specifically, to have similar mechanical and/or chemical properties. For example, the primer layer can also comprise the polymer matrix of the HOE-capable polymer layer. However, it would be possible for the primer layer to comprise a further polymer, which can nevertheless have similar physical and chemical properties to the polymer matrix or the HOE polymer of the HOE-capable polymer layer. It can be therefore be possible for various advantageous effects, as were explained above with respect to the primer layer, alternatively or in addition to the primer layer, to be achieved by mean of the HOE-capable polymer layer.

In the preceding, the substrate, the HOE-capable polymer layer, the hard layer, the antireflective layer, the clean-coat layer, and the primer layer were explained with respect to the spectacle lens. It is possible for the spectacle lens to comprise further or different layers. For example, further properties of the spectacle lens can be realized or improved with further layers. For example, a layer can be provided in order to reduce water condensation. Such a layer can be configured to be hydrophilic. It would also be possible to provide a layer for polarization filtering of the incident light. It is also possible to provide a layer with photochromatic properties. In these above-mentioned techniques, layers with a layer thicknesses of up to 100 μm are typically used. The materials used in such layers can frequently be relatively soft, for example having a softness comparable to that of the HOE-capable polymer layer. Typically, such layers can be arranged on the polymer substrate and, for example, be directly adjacent to it. More particularly, it is possible for such layers to be arranged between the substrate and the hard layer.

In the preceding, aspects of a spectacle lens were illustrated according to various embodiments. By means of corresponding techniques, it can be possible to integrate the HOE-capable polymer layer into a stack of layers according to conventional spectacle lenses. In this case, integration can be carried out in such a way that a function of the conventional hard layer and antireflective layer is not or not significantly impaired. More particularly, it can be possible for the HOE-capable polymer layer to have mechanical properties that are comparable to those of a conventional primer layer. For this reason, it may be unnecessary to provide a primer layer in a spectacle lens according to various embodiments. This may be the case because a material of the HOE-capable polymer layer can have chemical and mechanical properties that are similar to a material of the conventional primer layer. Depending on the optical requirement profile—for example, with respect to layer thickness and efficiency—the HOE-capable polymer layer can therefore completely or partially assume the role of the conventional primer layer.

According to a further embodiment, the invention relates to a method for producing a spectacle lens. The spectacle lens comprises an HOE-capable polymer layer that is suitable for forming an HOE. The method comprises coating of a transparent substrate of the spectacle lens with a precursor of the HOE-capable polymer layer. The method further comprises converting the precursor, which is arranged on the transparent substrate, for forming the HOE-capable polymer layer.

It is therefore possible for the HOE-capable polymer layer to be produced in situ on the substrate. Converting the precursor into the HOE-capable polymer layer can be carried out, for example, by heating, drying, and/or, for example, thermal curing. Physical conversion steps can thus also be used. The precursor can, for example, comprise the photoreactive component. For example, the precursor can comprise the polymer reactant. The precursor can comprise the photoreactive component in the form of a dispersion or solution. It is possible for neither the precursor nor the HOE-capable polymer layer to form the HOE; a further, optional exposure step may be required for this purpose.

It is also possible for the conversion to comprise a chemical reaction, i.e. to take place reactively. For example, the conversion can comprise the formation of the polymer matrix of corresponding reactants, for example, isocyanate and polyol. Further reactants can be applied, for example, during the conversion, such as light-sensitive additives or other additives. More specifically, this can take place with a homogeneous layer thickness.

For example, the precursor can comprise a polymeric carrier film that contains the HOE-capable layer. Such techniques are known, for example, from the document US 2010/0203241 A1 or under the brand name Bayfol® HX from the firm Bayer Material Science AG, Leverkusen, Germany. In this case, for example, a PUR-based polymer matrix for taking up light-sensitive molecules can be used as the photoreactive component. In this case, the photoreactive component comprises the HOE-forming polymer, which is rearranged on exposure and thus allows the differences in the reactive index in the range of 0.005 to 0.05 that are required for the formation of holograms. The precursor is not limited to a polymeric carrier film; in general, it is possible for the precursor to comprise other or further substrate materials.

Coating of the substrate with the precursor can, for example, comprise wet coating techniques, such as, for example, immersion coating and spin coating, spraying, and/or flow coating. Alternatively or additionally, coating can comprise printing methods, such as, for example, inkjet and/or pad printing.

Furthermore, the method can comprise cleaning of the substrate prior to coating. For example, the cleaning can be carried out using a suitable solvent. Furthermore, the method can comprise activation of the substrate prior to coating. For example, activation can comprise chemical activation with a suitable agent and/or physical activation, for example, by means of suitable plasma or corona treatment.

Such techniques for producing the spectacle lens according to the embodiment currently under discussion could be used repeatedly, for example, for a plurality of HOE-capable polymer layers.

In the preceding, techniques were illustrated in which the HOE-capable polymer layer can be produced in situ on the substrate of the spectacle lens. However, it is also possible for the HOE-capable polymer layer to be produced in a separate step and then transferred to the substrate. This will be explained in further detail in the following.

According to a further embodiment, the invention relates to a method for producing a spectacle lens. The spectacle lens comprises an HOE-capable polymer layer that is suitable for forming an HOE. The method comprises the coating of a carrier with a precursor of the HOE-capable polymer layer. The method further comprises converting the precursor, which is arranged on the carrier, in order to obtain the HOE-capable polymer layer. The method further comprises fixing of the HOE-capable polymer layer on a transparent substrate of the spectacle lens.

With respect to the precursor, converting the precursor, the substrate, and the HOE-capable polymer layer, features explained above in connection with further embodiments can be used. It is therefore possible for coating of the carrier and converting the precursor to take place individually and separately from the substrate. In fixation of the HOE-capable polymer layer, the carrier can then be moved closer to the substrate; this can be carried out by turning a side of the carrier on which the HOE-capable polymer layer is located toward the substrate. The HOE-capable polymer layer can then, for example, be fixed on the substrate by applying mechanical pressure. By means of such techniques, it is possible to produce the HOE-capable polymer layer without damaging the substrate. Moreover, the carrier can be particularly suitable for participating in the steps required for conversion. For example, the carrier can be a film or a half shell.

For example, fixation of the HOE-capable polymer can be carried out by gluing and/or laminating. After fixation of the HOE-capable polymer layer, for example, the method can further comprise removing the carrier from the HOE-capable polymer layer. For this purpose, the carrier can be prepared accordingly. For example, this preparation can consist of selective adjustment of the adhesion so that the adhesion to the carrier is weaker than to the substrate.

Alternatively, it would also be possible for the carrier to remain arranged on the substrate. The carrier can be configured for this purpose to be transparent, at least for visible light. In such a case, it would be possible for the carrier to be coated on its back side with an antireflective layer and/or a clean-coat layer and/or a hard layer and/or a further functional layer before it is applied to the substrate. The carrier can be produced, for example, from the same material as the transparent substrate or from a different material.

Such techniques for producing the spectacle lens according to embodiment currently under discussion could be repeatedly used, for example, for a plurality of HOE-capable polymer layers.

The methods for producing the spectacle lens can further comprise applying the hard layer to the HOE-capable polymer layer. Alternatively or additionally, the methods for production can further comprise applying the antireflective layer. Alternatively or additionally, the methods for production can further comprise applying the clean-coat layer.

The hard layer can serve to improve adhesion of the antireflective layer, the clean-coat layer and/or further layers to the substrate. Moreover, the hard layer can improve the thermal and mechanical properties of the spectacle lens. The layer thickness of the hard layer can, for example, be 1-3 µm. Typically, the hard layer comprises polysiloxane-based organic/inorganic hybrid materials. It is possible, for example, for applying the hard layer to comprise wet chemical techniques. The wet chemical techniques can comprise, for example, immersion coating or spin coating. In addition, application can comprise hard layer curing. The curing can, for example, comprise thermal curing by means of heating and/or UV exposure.

For applying the antireflective layer, an interference layer stack composed of alternating oxidic materials such as $SiO_2$, $TiO_2$, $ZrO_2$ or $Al_2O_3$ in a suitable order and layer thickness can be applied by means of a physical deposition process from the gas phase (physical vapor deposition, PVD). The layer thickness of the antireflective layer can be, for example, in the range of 300 nm-500 nm.

Optionally, by using similar processes, more specifically PVD, the clean-coat layer composed of corresponding fluorine-containing precursors can be applied as an optically inactive uppermost layer of the spectacle lens. The clean-coat layer can have a layer thickness of less than 10 nm.

The HOE-capable polymer layer can be arranged on a convex front side of the transparent substrate. It is possible for the HOE-capable polymer layer to be arranged on a concave back side of the transparent substrate. In so-called back side processing, arrangement of the HOE-capable polymer layer on the spherical front side can offer advantages.

For example, the precursor and/or the HOE-capable polymer layer can comprise the photoreactive component and/or the HOE polymer and/or the polymer matrix. The method can further comprise applying a primer layer comprising a polymer matrix and/or a further polymer to the substrate. For example, applying the primer layer can be carried out by a wet chemical process based on a polymer dispersion. Typically, the layer thickness of the primer layer is in the range of 0.7-1.0 µm. The stability or robustness of the spectacle lens can be further increased by applying the primer layer.

The method for producing the spectacle lens can further comprise spatially resolved exposure of the HOE-capable polymer layer in order to form the HOE. Exposure can be carried out, for example, by means of writing techniques in which one or a plurality of laser beams is/are guided or scanned over the surface of the HOE-capable polymer; in this case, the laser beams can have a relatively small-area beam diameter. Alternatively or additionally, interference techniques can be used in which a plurality of relatively large-area laser beams are used. The HOE polymer can be formed by means of exposure from the photoreactive component, i.e., for example, the photomonomer or photopolymer. The image to be exposed can then be fixed. In this case, light-sensitive components of the HOE-capable polymer layer can react off and form a light-insensitive film. This applies for example to a photoreactive component remaining after exposure, for example at unexposed sites.

It is possible for exposure to take place in the uncoated HOE-capable polymer layer, i.e., for example, before applying the hard layer, and optionally the antireflective layer and/or the clean-coat layer, etc. However, it is also possible for spatially resolved exposure of the HOE-capable polymer layer to take place after applying the hard layer. More specifically, this can be desirable in cases where the hard layer, and optionally the antireflective layer and/or the clean-coat layer, are transparent to the light used for exposure and cause no or no significant optical interference effects. In this case, blackening of the back side (black backing) can be used to reduce or prevent back side reflections.

In the case described above, following exposure after applying the hard layer, and optionally the antireflective layer and the clean-coat layer, it can be possible to keep or store a prefabricated spectacle lens with all of the layers of a corresponding stack of layers. Exposure can then be carried out to form the HOE. More specifically, this can allow simpler and more rapid production of the spectacle lens with an integrated HOE.

A scenario was described above in which converting the precursor in order to obtain the HOE-capable polymer layer is carried out on a carrier, wherein the HOE-capable polymer layer is then fixed on the transparent substrate of the spectacle lens. More particularly, it is possible in such a scenario for spatially resolved exposure of the HOE-capable polymer layer to take place before fixation of the HOE-capable polymer layer on the transparent substrate. In other words, the HOE can already be formed on the carrier, for example, a film, and the exposed HOE-capable polymer layer, which already constitutes the HOE, can then be fixed on the substrate. Fixation can be carried out by means of laminating and/or gluing. In this case, it can be desirable at the time of exposure to make allowances for compression/distortion of the HOE due to the geometry of a surface of the substrate. For example, spatially resolved exposure can comprise the obtaining of geometric data that describe a geometry of the substrate of the spectacle lens. The spatially resolved exposure can further comprise the determining control data depending on the geometric data. The control data can describe an intensity and phase of the spatially resolved exposure. Spatially resolved exposure can take place using the control data. By means of such techniques, it is possible to carry out exposure on the carrier in a separate process. Black backing can also be easier to carry out.

In the preceding, various techniques for producing the spectacle lens comprising the HOE-capable polymer layer were explained. In general, the above-described techniques can be carried out in prescription lens production on a processed prescription lens or finished lens. However, it would also be possible for the above-described techniques to be carried out with respect to a semifinished lens from which a prescription lens is to be produced in a later step. In the latter case, it can be advantageous to use the hard layer to protect the HOE-capable polymer layer from damage in subsequent prescription lens production. In such a case, processing in prescription lens production should be carried out on the side of the spectacle lens that is not coated with the HOE-capable polymer layer.

The features and features explained above, which are described in the following, can be used not only in the corresponding combinations specifically set forth, but also in further combinations or in isolation, without departing from the scope of protection of the present invention.

BRIEF DESCRIPTION OF THE FIGURES

The above-described properties, features, and advantages of this invention and the manner in which these are achieved become clearer and easier to understand in connection with the following description of the examples, which are described in further detail with reference to the drawings.

DETAILED DESCRIPTION OF EXAMPLES

In the following, the present invention is described in further detail by means of preferred embodiments with reference to the drawings. In the figures, the same reference numbers refer to the same or similar elements. The figures are schematic views of various embodiments of the invention. Elements shown in the figures are not necessarily drawn to scale. Rather, the various elements shown in the figures are shown in such a manner that their function and purpose become clear to the person skilled in the art.

In the following, techniques are explained in connection with the preparation of an HOE-capable material in a spectacle lens.

Figure 1:
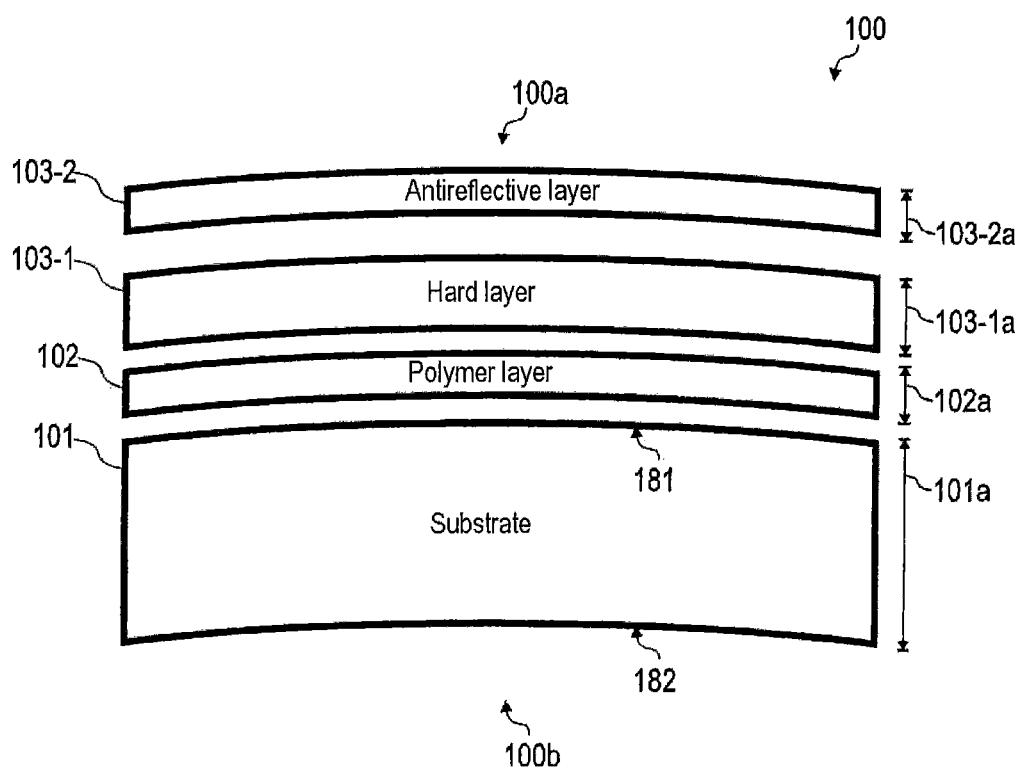
FIG. 1 is a schematic exploded view of a spectacle lens with various layers according to various embodiments.

FIG. 1 shows a spectacle lens 100 according to various embodiments in an exploded schematic drawing. The spectacle lens can, for example, be used in spectacles such as data spectacles (not shown in FIG. 1). The spectacle lens 100 comprises a substrate 101. The center thickness 101a of the substrate 101 is typically approx. 1-3 mm. The substrate is transparent to light in the visible wavelength range.

An HOE-capable polymer layer 102 is arranged adjacent to the substrate 101. The HOE-capable polymer layer 102 is suitable for forming the HOE. The HOE-capable polymer layer 102 comprises, for example, an HOE polymer or a photoreactive component comprising a polymer reactant of the HOE polymer. The HOE polymer can be formed by means of local polymerization and/or diffusion processes of the polymer reactant, which in turn can lead to local variation in the refractive index. This can make it possible to implement an optical function of the spectacle lens 100. The HOE polymer or the photoreactive component can be embedded, for example, in a PUR-based polymer matrix. For example, one or two diffusion barrier layer(s) could be further provided adjacent to the polymer layer 102 (not shown in FIG. 1).

FIG. 1 further illustrates the layer thickness 102a of the HOE-capable polymer layer 102. The layer thickness 102a of the HOE-capable polymer layer is in a range of 1 μm to 100 μm, and preferably in a range of 50 μm to 100 μm. Typically, the effect on the optical properties of the spectacle lens 100 exerted by the HOE can be greater with increasing layer thickness 102a of the HOE-capable polymer layer 102. By means of greater layer thicknesses 102a, more complex optical functionalities can be implemented, i.e., for example, the optical path of the light through the HOE can be more strongly modified.

The spectacle lens 100 of FIG. 1 comprises a multilayer coating, further comprising a hard layer 103-1 and an antireflective layer 103-2. The layer thickness 103-1a of the hard layer 103-1 is in the range of 1 μm to 3 μm. The layer thickness 103-2a of the antireflective layer 103-2 is in the range of approx. 300 to 500 nm. For example, the antireflective layer 103-2 has an interference layer stack composed of oxidic materials such as $SiO_2$, $TiO_2$, $ZrO_2$, and $Al_2O_3$ in a suitable sequence and layer thickness.

Alternatively or additionally, an antireflective layer can be provided on a back side 100b of the spectacle lens 100.

Optionally, for example, the spectacle lens 100 can comprise a clean-coat layer (not shown in FIG. 1). The clean-coat layer can, for example, adjacent to the antireflective layer 103-2, form a closure of the spectacle lens 100 on its front side 100a. The clean-coat layer can, for example, have a layer thickness in the range of 5 nm-50 nm.

FIG. 1 shows a scenario in which the HOE-capable polymer layer 102 is arranged on a convex front side 181 of the substrate 101, which faces toward the front side 100a of the spectacle lens 100. However, it would also be possible for the HOE-capable polymer layer 102 to be arranged on a concave back side 182 of the substrate 101, which faces toward the back side 100b of the spectacle lens 100.

FIG. 1 shows a scenario in which the spectacle lens 100 comprises an individual HOE-capable polymer layer 102. However, it would also be possible for the spectacle lens 100 to comprise more than one HOE-capable polymer layer 102. For example, the spectacle lens 100 could comprise a first HOE-capable polymer layer 102 on the convex front side 181 of the transparent substrate 101 and a second HOE-capable polymer layer on the concave back side 182 of the transparent substrate 101 (not shown in FIG. 1).

By means of a combination of a plurality of HOE-capable polymer layers 102, which, for example, form various HOEs, special optical functionalities can also be achieved by coherent or incoherent interaction of the various HOEs. This can be desirable, for example, in connection with the implementation of data spectacles. Examples of this are arrangements according to the actuator-compensator principle, cf. the German patent application with application no. 102014209792.4. As a further example of the arrangement, a multilayer system comprising a plurality of HOE-capable polymer layers forming various HOEs would be conceivable, said system being used for so-called angle multiplexing. In this case, the optical functionality of an individual HOE, for example focussing, is limited to a narrow viewing angle range of the spectacle wearer, while the other viewing angle ranges are unaffected by this HOE. In such a scenario, each layer of the multilayer system can contain a further HOE that is optically functional for a different viewing angle range. The HOEs act independently of one another, so that each constitutes an independent optical function for a defined viewing angle range. Together, their optical action extends over the entire viewing angle range.

Figure 2:
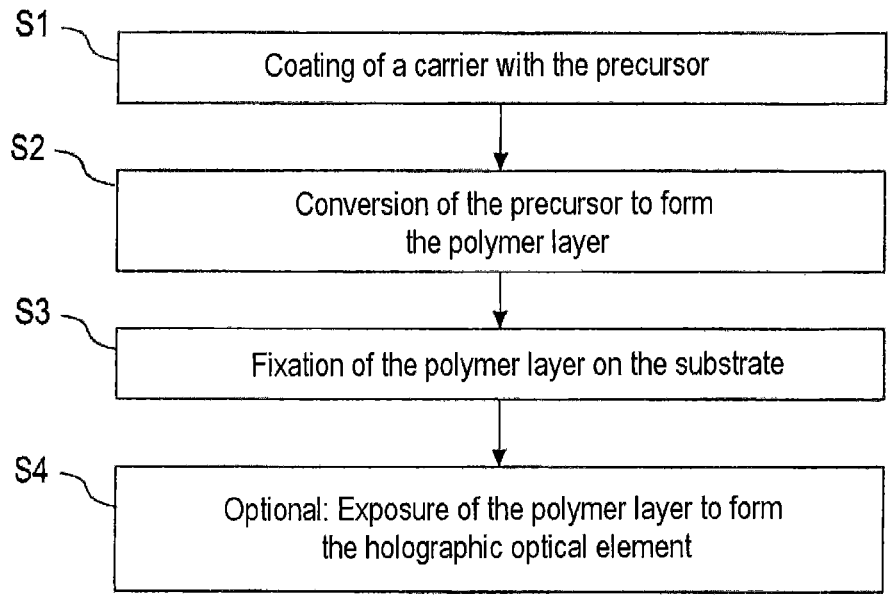
FIG. 2 is a flow diagram of a method for producing a spectacle lens according to various embodiments, wherein in said method, an HOE-capable polymer layer that is suitable for forming an HOE is produced on a separate carrier.

FIG. 2 shows a flow diagram of a method for producing a spectacle lens 100 according to various embodiments. In this case, formation of the HOE-capable polymer layer 102 is not carried out in situ on the substrate 101, but separately on a separate carrier.

In step S1, the carrier is first coated with a precursor of the HOE-capable polymer layer 102. In this case, the precursor of the HOE-capable polymer layer 102, for example, can be liquid or solid; the precursor can, for example, be prepared in film form. The precursor of the HOE-capable polymer layer 102 cannot yet be suitable, or can be suitable only to a limited extent, for forming the HOE. For example, the precursor can comprise a special formulation of polymers that are suitable for forming the polymer matrix; it would also be possible for the precursor to comprise reactants of the polymers that are suitable for forming the polymer matrix, depending on whether or not a reactive conversion takes place in step S2. For example, the precursor can comprise further additives, such as, for example, a catalyst or a flow promoter, which are required for forming the polymer matrix. The precursor can, for example, contain photoreactive components, which, for example, can comprise monomers, initiators, and/or dyes, etc.

In step S2, the precursor for forming the HOE-capable polymer layer 102 is converted. In step S2, for example, thermal curing of the precursor can be carried out to form a stable film as the HOE-capable polymer layer 102; for example, the formulation can be converted by evaporation of the solvent into a solid film, for example, by forming the polymer matrix. Alternatively or additionally, reactive process steps that include a chemical reaction can also be carried out in step S2. For example, in step S2, the polymer matrix can be formed by a suitable reaction of individual molecules. In step S2, for example, further additives and/or light-sensitive additives can be added to the precursor.

In step S3, the HOE-capable polymer layer 102 is fixed on the substrate 101. This is typically carried out by gluing or laminating of the HOE-capable polymer layer 102 onto the substrate. It would be possible to subsequently remove the carrier from the spectacle lens 100. However, it is also possible for the carrier to remain on the HOE-capable polymer layer 102.

In step S4, the HOE-capable polymer layer 102 is exposed to form the HOE. Step S4 is an optional step; however, step S4 should be carried out if the HOE is actually to be formed. In step S4, the polymer reactant is converted into the HOE polymer; in this case, reactive conversion of the photoreactive component, for example, a photomonomer or a photopolymer, takes place during polymerization and/or diffusion. This process results in spatially well-defined variation of the refractive index in the polymer layer, allowing optical features in the form of the HOE to be implemented.

Figure 3:
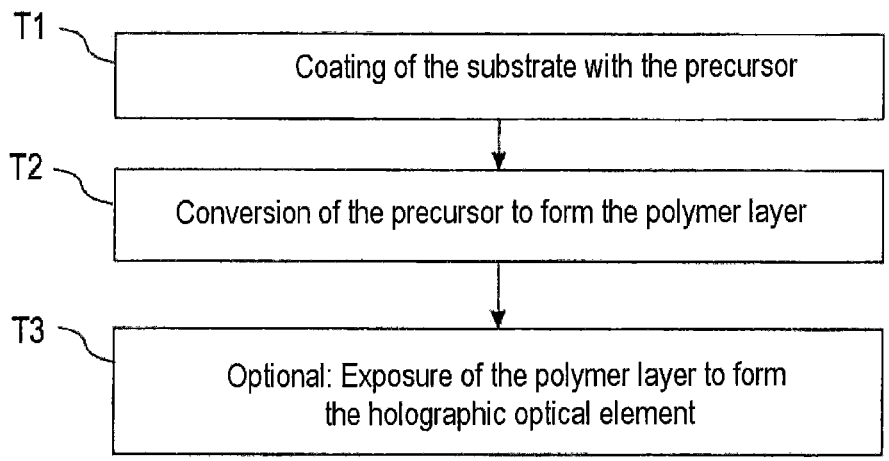
FIG. 3 is a flow diagram of a method for producing a spectacle lens according to various embodiments, wherein in said method, an HOE-capable polymer layer that is suitable for forming the HOE is produced in situ on a substrate of the spectacle lens.

FIG. 3 shows a flow diagram of a further method for producing a spectacle lens 100 according to various embodiments. In this case, the formation of the HOE-capable polymer layer 102 takes place in situ on the substrate 101. The substrate 101 is first coated with the precursor in step T1.

Step T2 involves conversion of the precursor for forming the HOE-capable polymer layer 102. Step T2 can be carried out according to step S1 of FIG. 2.

In step T3, the HOE-capable polymer layer 102 is exposed to form the HOE. Step T3 is an optional step; step T3 must be carried out if the HOE is actually to be formed. Step T3 can be carried out according to step S4 of FIG. 2.

With respect to both step S3 of FIG. 2 and step T1 of FIG. 3, it can be desirable to pretreat the corresponding surface 181, 182 of the substrate 101 before applying the HOE-capable polymer layer 102 or the precursor of the HOE-capable polymer layer 102. For example, the corresponding surface 181, 182 of the substrate 101 can be cleaned. Alternatively or additionally, the corresponding surface 181, 182 of the substrate 101 can be activated.

Figure 4:
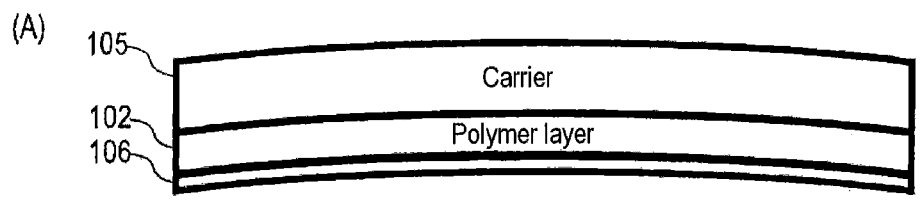
FIGS. 4-6 illustrate method steps of the method of FIG. 2 by means of schematic drawings of various production stages of the spectacle lens.
Figure 4:
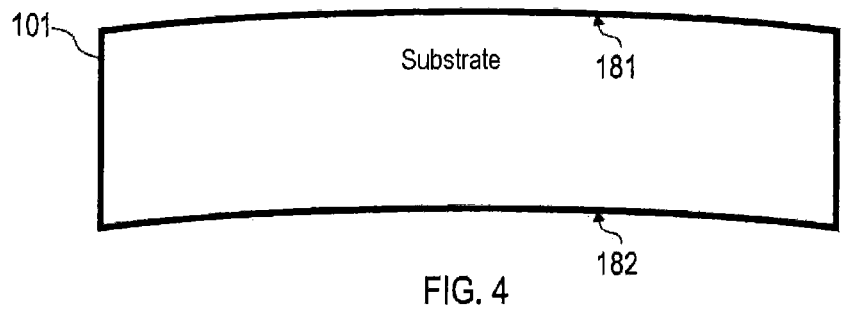
Figure 5:
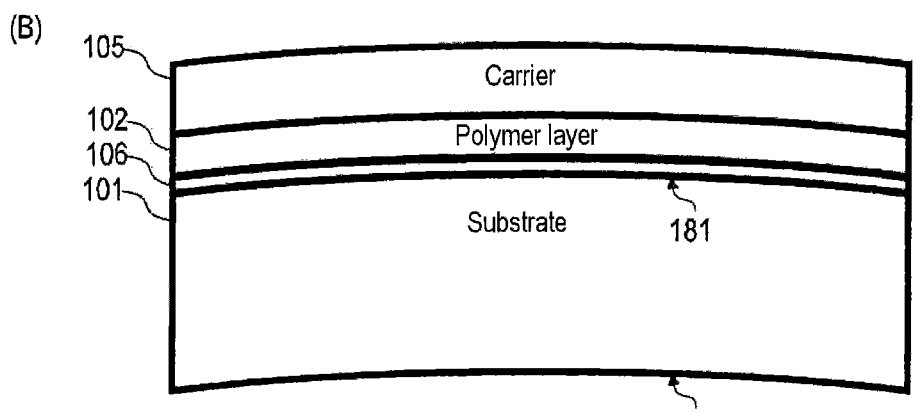
Figure 6:
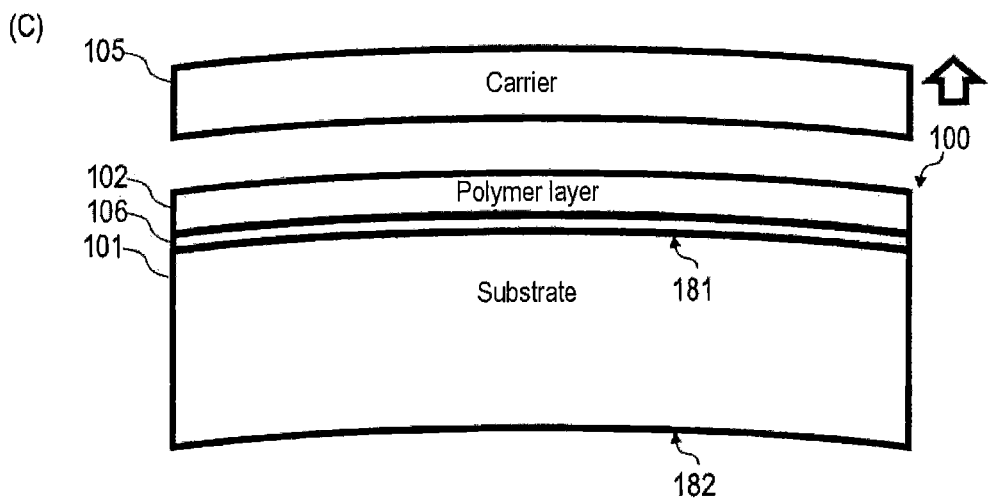

FIGS. 4-6 show schematic views of various production stages or production pieces of the spectacle lens 100 according to the method according to FIG. 2. In FIG. 4—which shows a situation A—the HOE-capable polymer layer 102 is on the carrier 105. For example, the carrier 105 can comprise a film or a half shell. For example, the half shell can be configured in a concave or convex shape. The carrier 105 can be formed in a complementary manner to the front side 181 of the substrate 101. Adjacent to the HOE-capable polymer layer 102, furthermore, an adhesive/laminate coating 106 is arranged on the carrier 105. Alternatively or additionally to the adhesive/laminate coating 106, solvent adhesion techniques can also be used.

FIG. 5 shows a situation B in which the carrier 105, the HOE-capable polymer layer 102, and the adhesive/laminate coating 106 are brought into contact with the substrate 101. More particularly, the adhesive/laminate coating 106 is brought into contact with the front side 181 of the substrate 101. Alternatively or additionally, it would also be possible to apply the HOE-capable polymer layer 102 to the back side 182 of the substrate 101.

FIG. 6 shows a situation C in which the carrier 105 is detached from the HOE-capable polymer layer 102 and removed therefrom (indicated in FIG. 6 by the vertical arrow). Alternatively, it would also be possible for the carrier 105 to remain on the HOE-capable polymer layer 102. In the latter case, it can be possible, for example, for the hard layer and/or the antireflective layer (neither shown in FIG. 6) to be formed on the outer surface of the carrier 105.

With this, situation C in the production process of the spectacle lens 100 is reached, in which the HOE-capable polymer layer 102 is arranged on the substrate 101. After this, coating with the hard layer 103-1 and/or the antireflective layer 103-2 and/or the clean-coat layer can be carried out (not shown in FIGS. 4-6). In general, it is also possible for the hard layer (not shown in FIGS. 4-6) to be already applied/laminated with the HOE-capable polymer layer 102.

Figure 7:
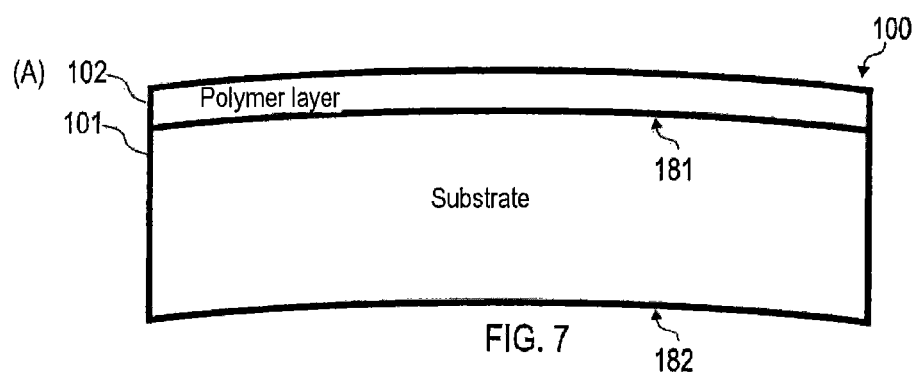
FIGS. 7-10 illustrate method steps of the method according to FIGS. 2 and 3 by means of schematic drawings of various production stages of the spectacle lens.

FIGS. 7-10 and FIGS. 11-14 show various scenarios for exposure of the HOE-capable polymer layer 102 to form the HOE. In this case, a situation A is first shown in FIG. 7 in which the HOE-capable polymer layer 102 is arranged on the substrate 101. For example, an adhesive/laminate layer (not shown in FIG. 7) could fix the HOE-capable polymer layer 102 adjacent to the front side 181 of the substrate 101. The HOE-capable polymer layer 102 is suitable for forming the HOE; for this purpose, the HOE-capable polymer layer 102 comprises a suitable photoreactive component which, for example, comprises the photomonomer. In FIG. 7, a reaction of this photoreactive component of the polymer layer has not yet taken place. The HOE-capable polymer layer 102 comprises the polymer matrix.

Figure 8:
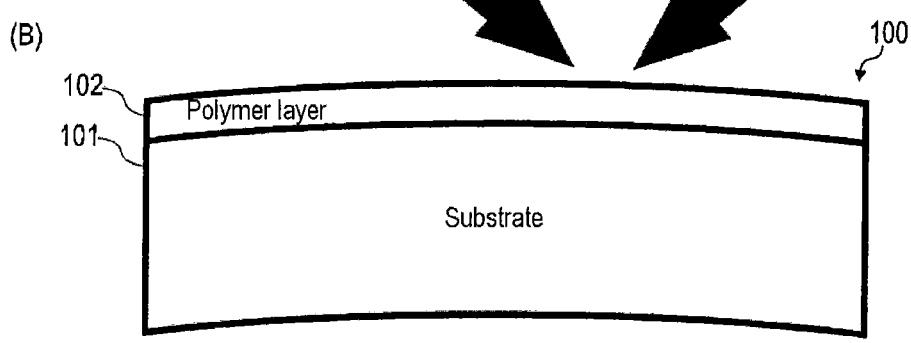
Figure 9:
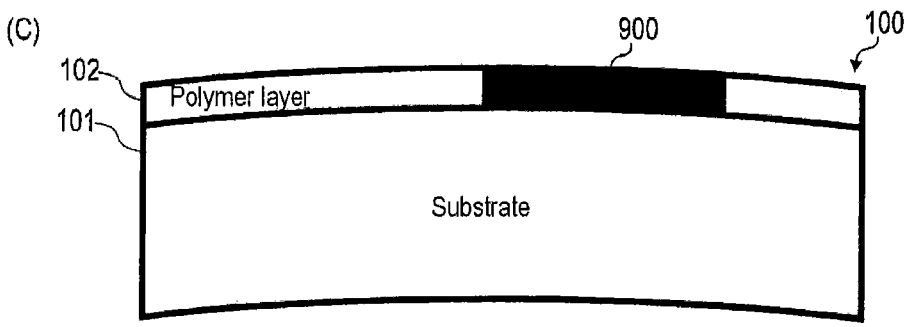

FIG. 8 shows a situation B during exposure of the HOE-capable polymer layer 102. Exposure is carried out in a spatially resolved and phase-coherent manner, with a well-defined phase and intensity (indicated in FIG. 8 by the two solid arrows). In this manner, the HOE 900 is formed (cf. FIG. 9). FIG. 9 shows a situation C in which the HOE 900 has an identification or branding function. For this reason, it is sufficient for the HOE 900 to extend only over a partial area of the entire surface of the HOE-capable polymer layer 102.

However, it would also be possible for exposure to take place such that the HOE 900 modifies the optical functionalities of the spectacle lens 100 relating to visual defects in the eye of the spectacle wearer. More particularly, in such a case, it can be desirable if the HOE 900 essentially extends over the entire surface of the HOE-capable polymer layer 102 (not shown in FIG. 9). In this manner, it can be possible to homogeneously implement corresponding optical functionality in the area of the spectacle lens 101.

Figure 10:
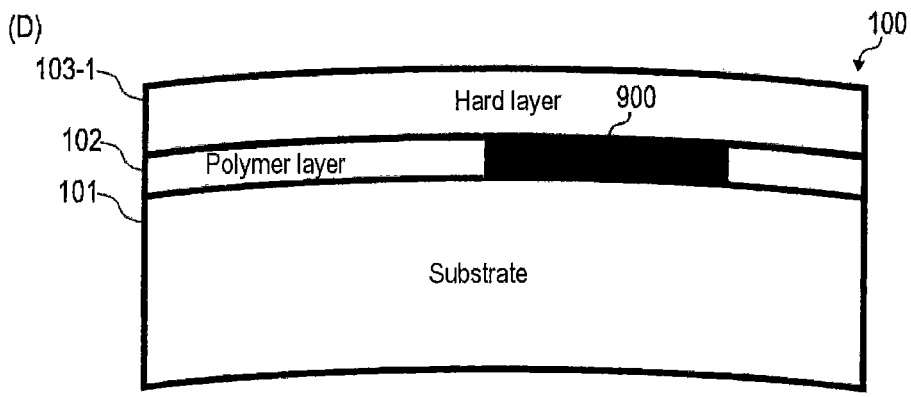

In situation D of FIG. 10, the HOE-capable polymer layer 102, which now forms the HOE 900, is coated with the hard layer 103-1. Optionally, coating with the antireflective layer 103-2 and/or the clean-coat layer can be carried out (not shown in FIG. 10).

FIGS. 11-14 shows further techniques relating to exposure of the HOE-capable polymer layer 102 to form the HOE 900. In these techniques, the HOE-capable polymer layer 102 is exposed after applying the hard layer 103-1.

Figure 11:
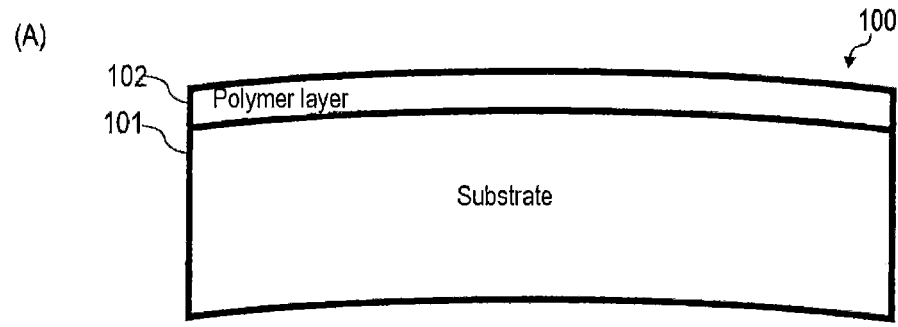
FIGS. 11-14 illustrate method steps of the method according to FIGS. 2 and 3 by means of schematic drawings of various production stages of the spectacle lens.
Figure 12:
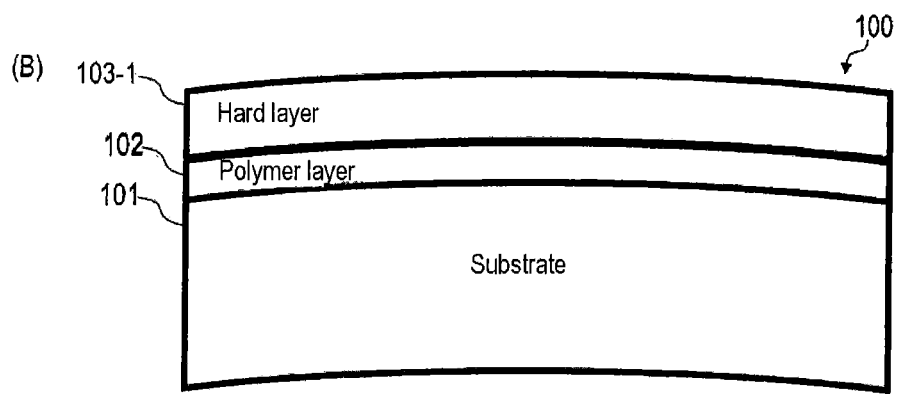

In situation A of FIG. 11, the HOE-capable polymer layer 102 is formed on the substrate 101. FIG. 12 shows a situation in which the hard layer 103-1 is arranged on the substrate 101, wherein the HOE-capable polymer layer 102 is located between the hard layer 103-1 and the substrate 101. The HOE-capable polymer layer 102 is suitable for forming an HOE 900. However, the HOE 900 is not yet shown in the situation of FIG. 12.

Figure 13:
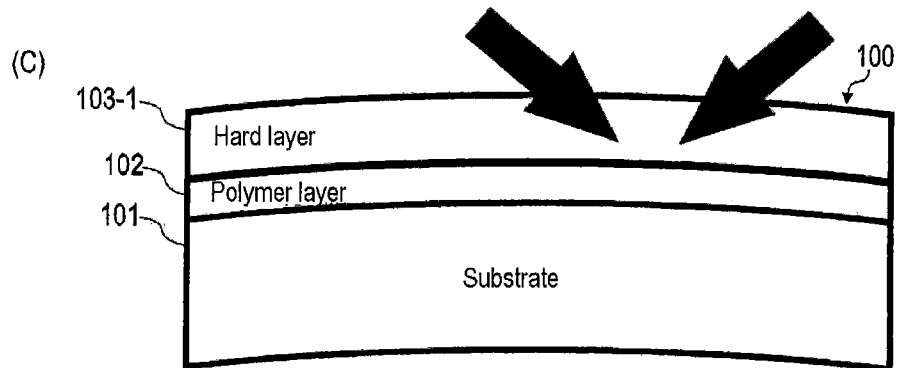

FIG. 13 shows a situation C during exposure of the HOE-capable polymer layer 102. The exposure is carried out through the hard layer 103-1, wherein the hard layer 103-1 is transparent for a used wavelength of the exposure light. Optionally, it would also be possible, in situation C of FIG. 13, for an antireflective layer to be arranged on the hard layer 103-1 (not shown in FIG. 13). Exposure could then also be carried out through the antireflective layer. In this case, particularly high efficiency of exposure can be achieved, as it is possible to reduce reflection losses.

Figure 14:
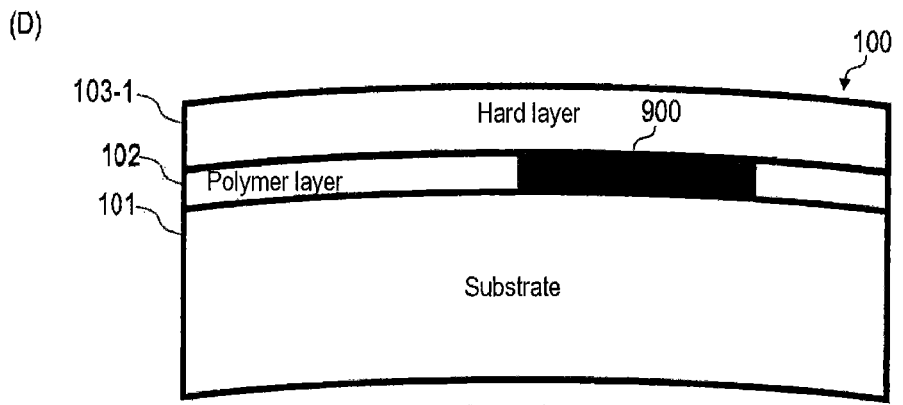

In situation D of FIG. 14, the HOE 900 is formed. This can be followed by fixation or bleaching in order to deactivate areas not exposed during the exposure. In this manner, subsequent modification, weakening, or destruction of the HOE 900 can be prevented. This is frequently also referred to as fixation of the HOE 900.

Techniques according to FIGS. 11-14 are advantageous in that the finished spectacle lens 100, for example in situation B according to FIG. 12, can be stored and exposed only at a later time in order to form the HOEs 900. This can allow particularly rapid production of the finished spectacle lens 100 with the formed HOE 900.

Figure 15:
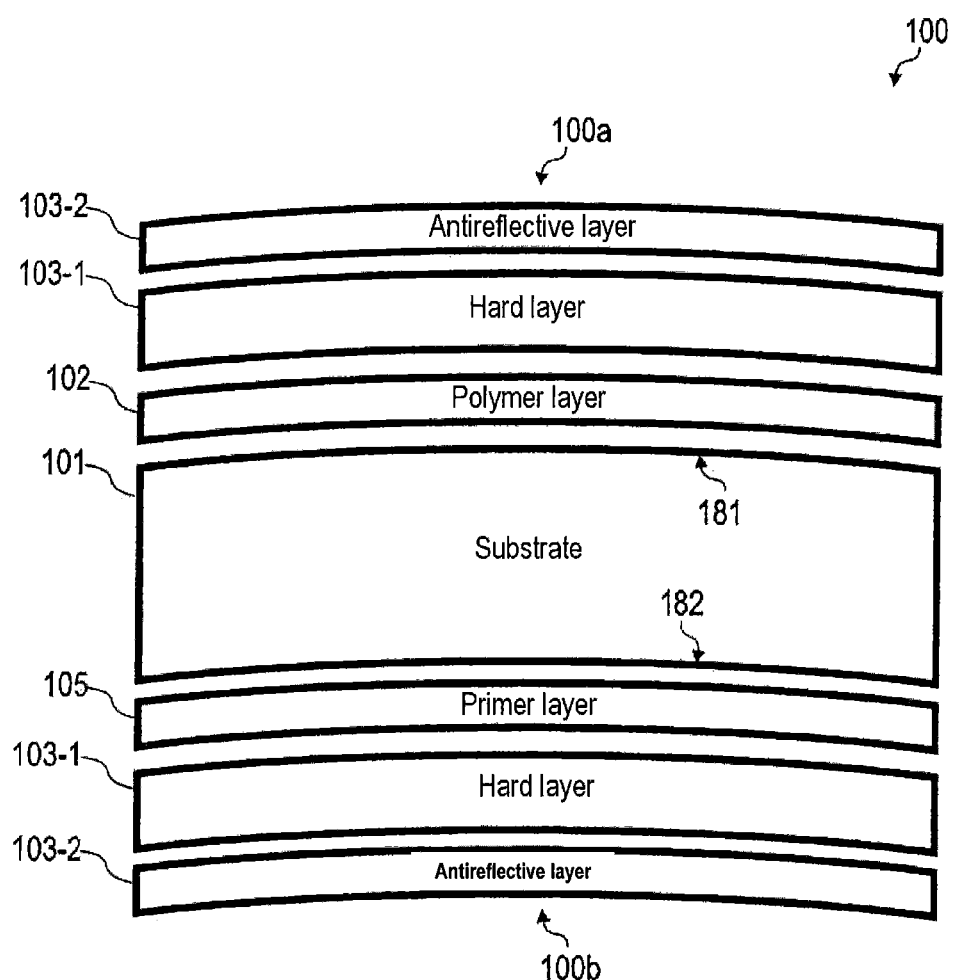
FIG. 15 is a schematic exploded view of a spectacle lens with various layers according to various embodiments.

FIG. 15 illustrates a spectacle lens 100 according to various embodiments of the invention in a schematic exploded view. The spectacle lens 100 in FIG. 15 has two hard layers 103-1 and two antireflective layers 103-2. A primer layer 105 is arranged on the back side 182 of the substrate 101. The primer layer 105 is optional. By means of the primer layer 105, the spectacle lens 100 can be strengthened. Moreover, improved adhesion of the hard layer 103-1 arranged on the back side and the antireflective layer 103-2 to the substrate 101 can be achieved; this is comparable to the effect that can be achieved by the polymer layer 102 with respect to the hard layer 103-1 arranged on the front side and the antireflective layer 103-2.

In the scenario of FIG. 15, for example, it would also be possible—in addition to the primer layer 102—to arrange a further primer layer on the front side 181 of the substrate 101 (not shown in FIG. 15). For example, the primer layer(s) could be applied using techniques of immersion coating.

Figure 16:
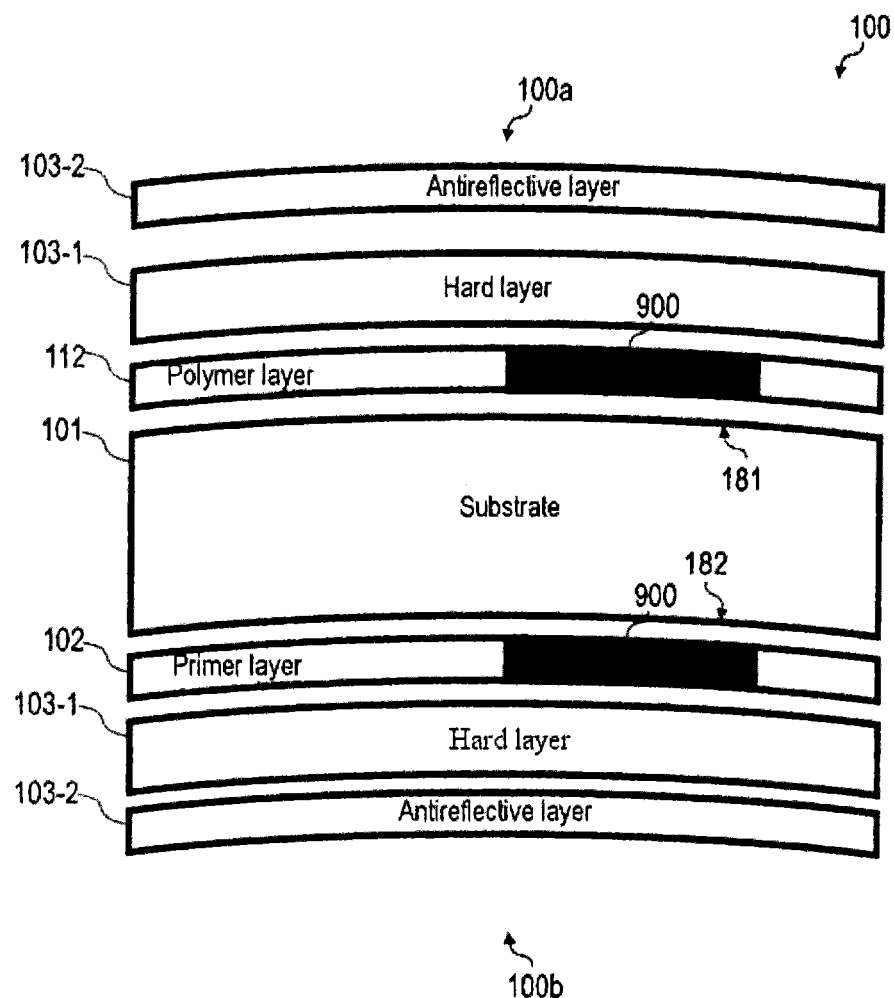
FIG. 16 is a schematic exploded view of a spectacle lens with various layers according to various embodiments.

With reference to FIG. 16, instead of the primer layer 105, a further HOE-capable polymer layer 112 could also be provided. In the scenario of FIG. 16, the HOEs 900 work together to implement optical functionality.

In the preceding, techniques were illustrated for providing an HOE-capable polymer layer 102 that is suitable for forming an HOE 900 in a spectacle lens 100. Such techniques show various effects and advantages. For example, it is possible to integrate the HOE-capable polymer layer 102, which is suitable for forming the HOE 900, into the spectacle lens 100 while maintaining the layered structure of a conventional spectacle lens 100. More particularly, it is possible for a break-stabilizing action of the primer layer 105 to be achieved by means of the HOE-capable polymer layer 102. For this reason, it can be unnecessary to provide the primer layer 105. Certain stresses, which for example may occur during the ball drop impact test according to FDA standards, can be better withstood in this manner. Typically, the HOE polymer or polymer reactant or a polymer matrix, which is used in the HOE-capable polymer layer 102, is similar to a polymer used in the primer layer 105. For this reason, it can also be possible for similar polymer chemistry such as that known, for example, with respect to the primer layer 105, to be used for the treatment of the HOE-capable polymer layer 102. More particularly, favorable adhesion of the polymer of the HOE-capable polymer layer 102 to the substrate 101 can be achieved. For this purpose, the substrate 101, for example, can be cleaned and/or activated. Moreover, favorable adhesion of the hard layer 103-1 to the HOE-capable polymer layer 102 can be achieved. This can make it possible to ensure overall favorable strength and durability of the spectacle lens 101. Moreover, it is possible according to the above-described techniques to provide semifinished or finished lenses that already comprise the hard layer 103-1 and optionally the antireflective layer 103-2 and/or the clean-coat layer with the HOE-capable polymer layer 102. Exposure of the HOE-capable polymer layer 102 to form the HOEs 900 can be carried out in a needs-based and individual manner, for example in order to provide customer data and/or adapted optical corrections. By means of the above-described techniques, it is also possible for the HOE 900 to be formed over the entire surface of the spectacle lens 100. In this case, an optical functionality implemented by means of the HOE 900 can be limited to a relatively minor extent. More particularly, it can also be possible to implement complex optical functionalities which, for example, go beyond a pure identification/branding function. By means of the above-described techniques, it is also possible to integrate more than one HOE-capable polymer layer 102 into the spectacle lens 100. More particularly, it can be possible to arrange a plurality of polymer layers 102, 112 on different sides 181, 182 of the substrate 101. In this manner, more complex optical functionalities can be achieved by means of the various HOEs 900 of the various polymer layers 102, 112.

Figure 17:
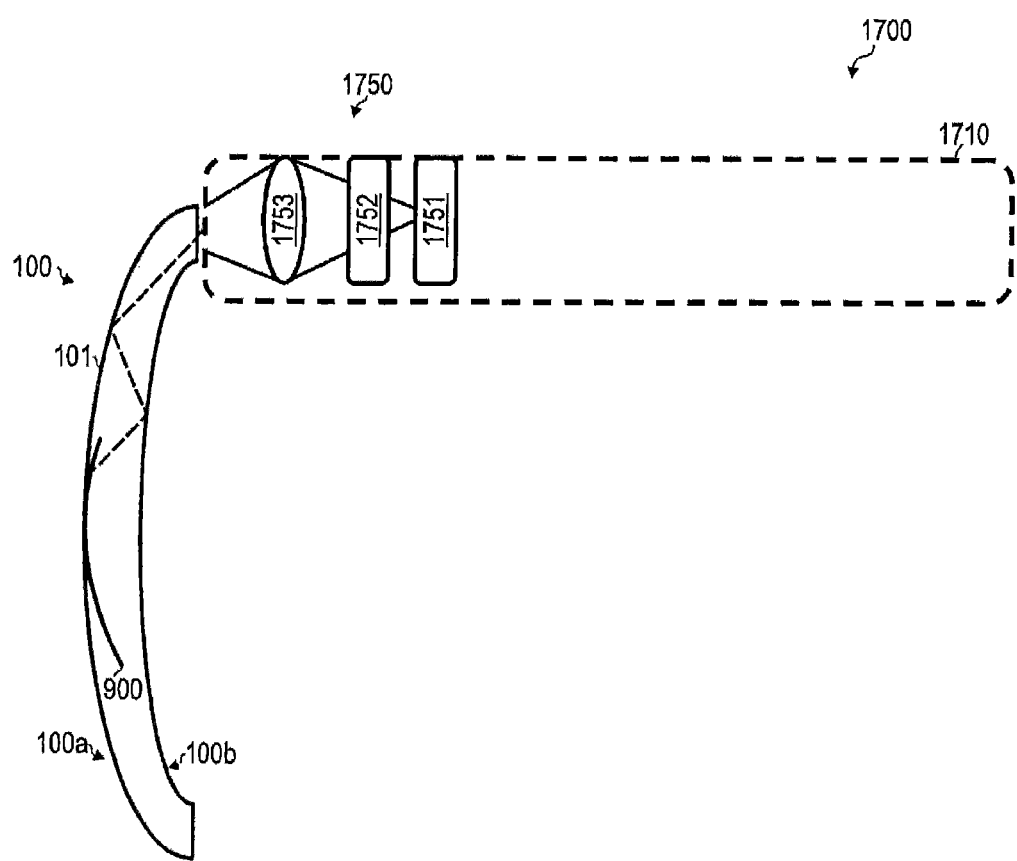
FIG. 17 is a schematic side view of data spectacles with an HOE according to various embodiments.
Figure 18:
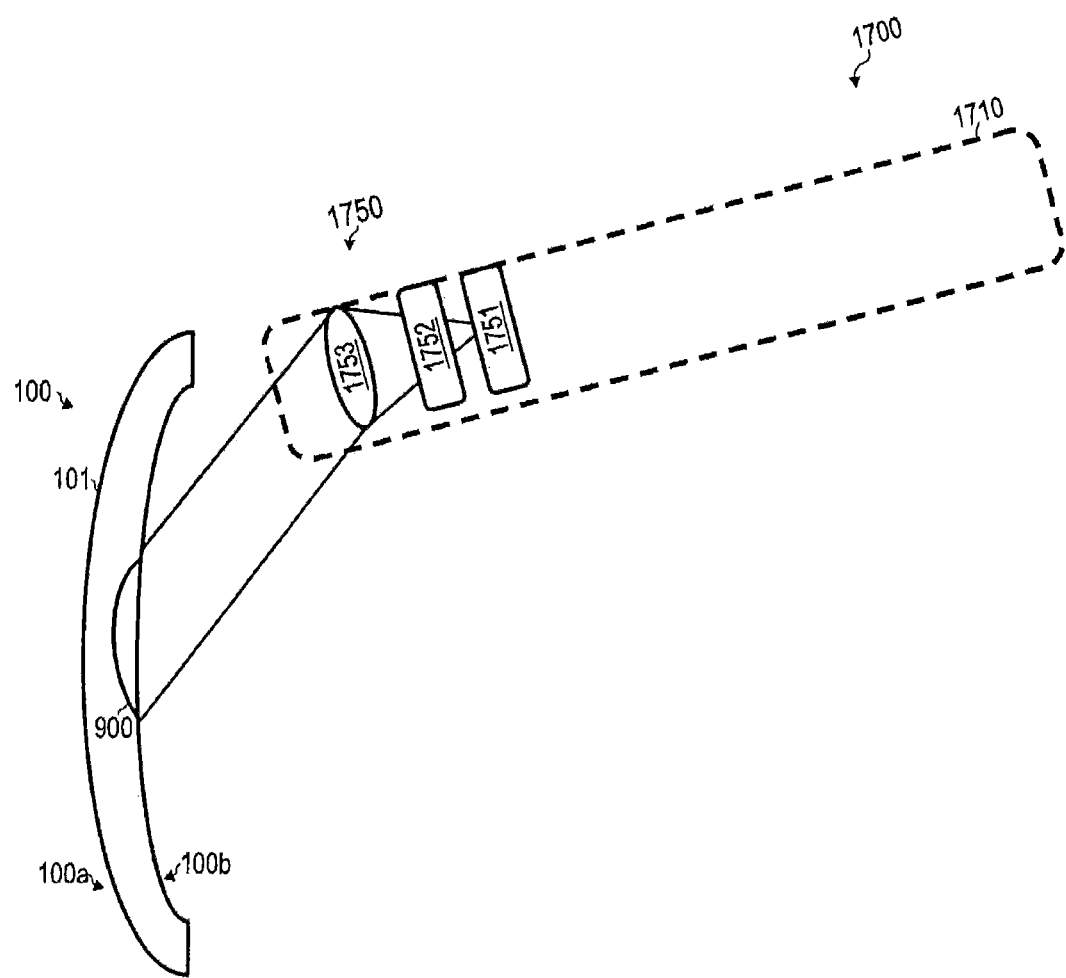
FIG. 18 is a schematic side view of data spectacles with an HOE according to various embodiments.

In FIGS. 17 and 18, embodiments of the HOE 900 used in combination with data spectacles 1700 are illustrated. The HOE 900 reflects light emitted from a light source assembly 1750 of the data spectacles 1700. In this case, for example, the HOE 900 implements the optical functionality of a wavelength-specific mirror; alternatively or additionally, it would also be possible for the HOE 900 to implement the optical functionality of an angle-specific reflector and/or a transflective beam combiner. In this respect, the HOE 900 thus shows imaging functionality.

Although only one individual HOE 900 is shown in each of FIGS. 17 and 18, the various optical functionalities implemented in connection with the data spectacles 1700 using the techniques of holography can also be implemented using two or more HOEs 900 interacting optically.

For purposes of clarity, only the substrate 101 and the HOE 900 are further illustrated in FIGS. 17 and 18; however, the spectacle lens 100 can also have an arrangement and number of elements as discussed above.

In detail, the data spectacles 1700 comprise a frame 1710. The frame 1710 has a housing in which the light source assembly 1750 is arranged. In general, the light source assembly 1750 can be configured in a wide variety of forms and comprise a variety of elements; for example, the light source assembly 1750 could comprise fewer or more elements than shown in FIGS. 17 and 18. In the example of FIGS. 17 and 18, the light source assembly 1750 comprises a display device 1751, such as, for example, a light-emitting diode (LED) display, a display with organic LED (OLED) technology, or a liquid crystal display (LCD). For example, the display device could comprise a LCD on silicon (liquid crystal on silicon, LCOS) display; more specifically, this could be used in connection with a pole splitter and an LED illumination unit arranged in the beam path behind the display device and in the direction of the spectacle lens 100. As a display device 1751, one could also use a laser light source, for example, in combination with a scanning device such as a moveable mirror, in order to scan the light beam over the retina of the eye of the user.

The light source assembly 1750 in the example of FIGS. 17 and 18 further has a filter element 1752 that filters light in a wavelength-specific manner. For example, the filter element 1752 can be a band pass element that selectively allows light of a specified wavelength band to pass through. More particularly, the filter element 1752 is optional.

The light source assembly 1750 further comprises an optical device 1753. The optical device 1753 is configured to guide light in the direction of the HOE 900 located in the spectacle lens 100. For this purpose, the optical device 1753 could comprise, for example, one or a plurality of lenses. The optical device 1753 could also alternatively or additionally comprise one or a plurality of mirrors, for example, one or a plurality of moveable mirrors.

In this manner, the light source assembly 1750 can be configured to emit light in the direction of the spectacle lens 100, more specifically, the HOE 900.

The HOE-capable polymer layer 102 or the HOE 900 is then configured to reflect the emitted light to the eye of a wearer of the data spectacles 1700. In the scenario of FIG. 17, the HOE 900 is arranged for this purpose adjacent to the front side 100a of the spectacle lens 100; in the scenario of FIG. 18, the HOE 900 is arranged for this purpose adjacent to the back side 100b of the spectacle lens 100. Here, in the scenario of FIG. 17, the light source assembly 1750 and the spectacle lens 100 are arranged with respect to each other such that the beam path of the light runs from the light source assembly 1750 to the HOE 900 inside the substrate 101 of the spectacle lens 100; here, internal reflection on the surfaces 100a, 100b of the spectacle lens 100 can be used for beam guidance (indicated in FIG. 17 by the broken line). In the scenario of FIG. 18, the light source assembly 1750 and the spectacle lens 100 are arranged with respect to each other such that the beam path of the light also runs from the light source assembly 1750 to the HOE 900 outside of the substrate 101 of the spectacle lens 100.

Of course, the features of the above-described embodiments and aspects of the invention can be combined with one another. More particularly, the features can be used not only in the described combinations, but also in other combinations or individually, without departing from the scope of the invention.

In the foregoing, the term "spectacle lens" was selected for purposes of simplicity and is not to be interpreted as limitative with respect to the material. More particularly, the spectacle lens can also be produced from one or a plurality of plastics.

The invention claimed is:

1. A method for producing a spectacle lens comprising a holographic optical element-capable (HOE-capable) polymer layer, wherein the HOE-capable polymer layer is suitable for forming a holographic optical element, wherein the method comprises:
   coating of a transparent substrate of the spectacle lens with a precursor of the HOE-capable polymer layer, and
   converting the precursor, which is arranged on the transparent substrate, for forming the HOE-capable polymer layer; and
   performing spatially resolved exposure of the HOE-capable polymer layer to form the holographic optical element,
   wherein the performing the spatially resolved exposure comprises:
      obtaining geometric data describing a geometry of the transparent substrate of the spectacle lens; and
      based on the geometric data, determining control data describing an intensity and a phase of the spatially resolved exposure,
      wherein the performing the spatially resolved exposure is carried out with the control data.

2. The method of claim 1, wherein the method further comprises:

applying at least one of a hard layer, an antireflective layer, or a clean-coat layer to the HOE-capable polymer layer.

3. The method of claim 2,
wherein the performing the spatially resolved exposure of the HOE-capable polymer layer takes place after applying at least one of the hard layer, the antireflective layer, and the clean-coat layer.

4. The method of claim 1, wherein the precursor and/or the HOE-capable polymer layer comprise a photoreactive component and/or an HOE polymer and/or a polymer matrix, and wherein the method further comprises:
applying a primer layer comprising the polymer matrix and/or a further polymer to the transparent substrate.

5. A method for producing a spectacle lens comprising a holographic optical element-capable (HOE-capable) polymer layer, wherein the HOE-capable polymer layer is suitable for forming a holographic optical element, wherein the method comprises:
coating of a carrier with a precursor of the HOE-capable polymer layer;
converting the precursor, which is arranged on the carrier, to obtain the HOE-capable polymer layer;
performing fixation of the HOE-capable polymer layer on a transparent substrate of the spectacle lens; and
performing spatially resolved exposure of the HOE-capable polymer layer to form the holographic optical element,
wherein the performing the spatially resolved exposure comprises:
obtaining geometric data describing a geometry of the transparent substrate of the spectacle lens; and
based on the geometric data, determining control data describing an intensity and a phase of the spatially resolved exposure,
wherein the performing the spatially resolved exposure is carried out with the control data.

6. The method of claim 5,
wherein the performing the fixation of the HOE-capable polymer layer is carried out by gluing and/or laminating.

7. The method of claim 6, wherein the method, after the fixation of the HOE-capable polymer layer on the transparent substrate, further comprises:
removing the carrier from the HOE-capable polymer layer.

8. The method of claim 5,
wherein the performing the spatially resolved exposure of the HOE-capable polymer layer takes place before the fixation of the HOE-capable polymer layer on the transparent substrate.

9. A method for producing a spectacle lens comprising a holographic optical element-capable (HOE-capable) polymer layer, wherein the HOE-capable polymer layer is suitable for forming a holographic optical element, wherein the method comprises:
coating of a carrier with a precursor of the HOE-capable polymer layer;
converting the precursor, which is arranged on the carrier, to obtain the HOE-capable polymer layer;
performing spatially resolved exposure of the HOE-capable polymer layer to form the holographic optical element; and
performing fixation of the HOE-capable polymer layer on a transparent substrate of the spectacle lens,
wherein the performing the spatially resolved exposure of the HOE-capable polymer layer takes place before the performing the fixation of the HOE-capable polymer layer on the transparent substrate, and
wherein the performing the spatially resolved exposure comprises:
obtaining geometric data describing a geometry of the transparent substrate of the spectacle lens, and
depending on the geometric data, determining control data describing an intensity and a phase of the spatially resolved exposure,
wherein the performing the spatially resolved exposure is carried out with the control data.

* * * * *

UNITED STATES PATENT AND TRADEMARK OFFICE
CERTIFICATE OF CORRECTION

| | | |
|---|---|---|
| PATENT NO. | : 10,534,196 B2 | Page 1 of 1 |
| APPLICATION NO. | : 15/736579 | |
| DATED | : January 14, 2020 | |
| INVENTOR(S) | : Pütz et al. | |

It is certified that error appears in the above-identified patent and that said Letters Patent is hereby corrected as shown below:

On the Title Page

Item (30) delete:
"Jun. 17, 2015 (DE) 10 2015 109 703"

Insert:
-- Jun. 17, 2015 (DE) 10 2015 109 703.6 --

Signed and Sealed this
Twelfth Day of May, 2020

Andrei Iancu
*Director of the United States Patent and Trademark Office*